(12) United States Patent
Vaupel et al.

(10) Patent No.: US 10,060,819 B2
(45) Date of Patent: Aug. 28, 2018

(54) PRESSURE SENSOR MODULE HAVING A SENSOR CHIP AND PASSIVE DEVICES WITHIN A HOUSING

(71) Applicant: Infineon Technologies AG, Neubiberg (DE)

(72) Inventors: Mathias Vaupel, Regensburg (DE); Matthias Boehm, Putzbrunn (DE); Steven Gross, Northville, MI (US); Markus Loehndorf, Munich (DE); Stephan Schmitt, Munich (DE); Horst Theuss, Wenzenbach (DE); Helmut Wietschorke, Laberweinting (DE)

(73) Assignee: Infineon Technologies AG, Neubiberg (DE)

( * ) Notice: Subject to any disclaimer, the term of this patent is extended or adjusted under 35 U.S.C. 154(b) by 231 days.

(21) Appl. No.: 14/945,661

(22) Filed: Nov. 19, 2015

(65) Prior Publication Data

US 2016/0169763 A1    Jun. 16, 2016

(30) Foreign Application Priority Data

Dec. 16, 2014   (DE) .......... 10 2014 118 769

(51) Int. Cl.
| | | |
|---|---|---|
| *G01L 7/00* | (2006.01) | |
| *G01L 9/12* | (2006.01) | |
| *G01L 19/00* | (2006.01) | |
| *G01L 19/14* | (2006.01) | |

(52) U.S. Cl.
CPC ........ *G01L 19/0084* (2013.01); *G01L 19/147* (2013.01); *G01L 19/148* (2013.01)

(58) Field of Classification Search
None
See application file for complete search history.

(56) References Cited

U.S. PATENT DOCUMENTS

| | | | |
|---|---|---|---|
| 6,805,010 B2 * | 10/2004 | Kuhnt | G01L 19/0092 73/700 |
| 8,072,081 B2 | 12/2011 | Wang | |
| 8,272,272 B2 | 9/2012 | Gebauer et al. | |
| 8,476,120 B2 | 7/2013 | Huang et al. | |
| 8,502,151 B2 | 8/2013 | Yao et al. | |
| 8,671,766 B2 | 3/2014 | Sterling et al. | |
| 9,006,847 B2 | 4/2015 | Welter et al. | |
| 9,698,131 B2 * | 7/2017 | Sanders | H01L 25/162 |
| 2007/0025092 A1 * | 2/2007 | Lee | H01L 23/49822 361/761 |
| 2007/0069376 A1 * | 3/2007 | Dangelmaier | H01L 21/6835 257/734 |

(Continued)

FOREIGN PATENT DOCUMENTS

| | | |
|---|---|---|
| CN | 102980712 B * | 12/2014 |
| DE | 10 2008 005 153 A1 | 7/2009 |

(Continued)

*Primary Examiner* — Andre Allen
(74) *Attorney, Agent, or Firm* — Dicke, Billig & Czaja, PLLC

(57) ABSTRACT

A pressure sensor module including a housing, a pressure sensor chip, and one or more of an integrated passive device (IDP) chip and discrete passive devices are disclosed. The pressure sensor chip and one or more of the IPD chip and the discrete passive devices are arranged within the housing.

18 Claims, 5 Drawing Sheets

(56) References Cited

U.S. PATENT DOCUMENTS

| | | | |
|---|---|---|---|
| 2008/0017907 A1* | 1/2008 | Otremba | H01L 23/49575 257/306 |
| 2010/0013106 A1* | 1/2010 | Otremba | H01L 21/561 257/777 |
| 2010/0102458 A1* | 4/2010 | Chow | H01L 21/565 257/778 |
| 2010/0109103 A1 | 5/2010 | Tsao | |
| 2014/0211444 A1* | 7/2014 | Gerber | H05K 7/02 361/809 |
| 2014/0332980 A1* | 11/2014 | Sanders | H01L 21/6835 257/774 |
| 2016/0211318 A1* | 7/2016 | Yeh | H01L 28/40 |
| 2016/0329260 A1* | 11/2016 | Dinkel | H01L 23/142 |

FOREIGN PATENT DOCUMENTS

| | | |
|---|---|---|
| DE | 10 2010 039 599 A1 | 2/2012 |
| DE | 10 2012 208 361 A1 | 1/2013 |
| WO | 2008/008140 | 1/2008 |

\* cited by examiner

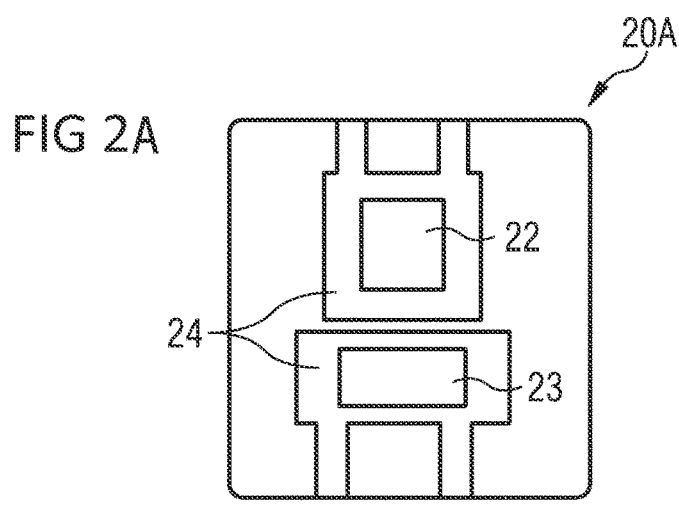
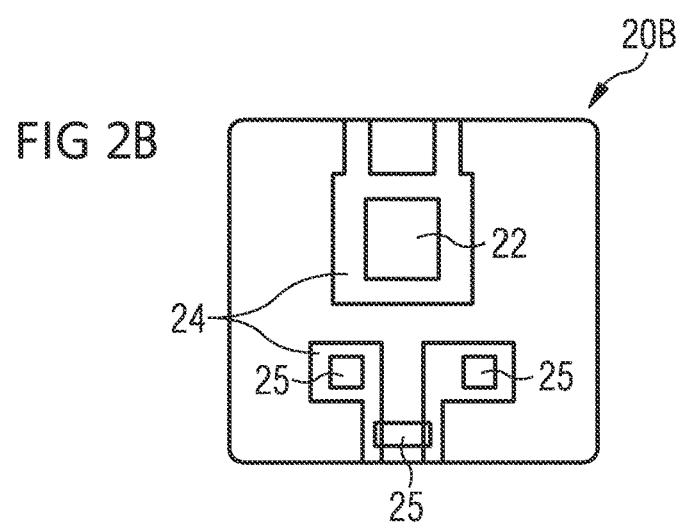
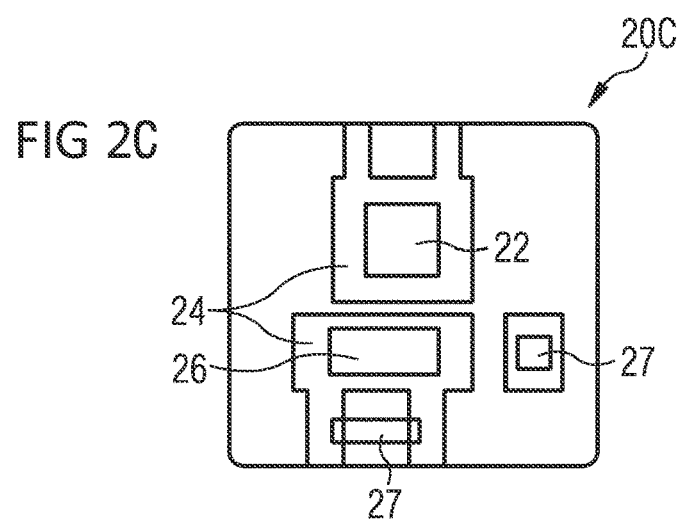

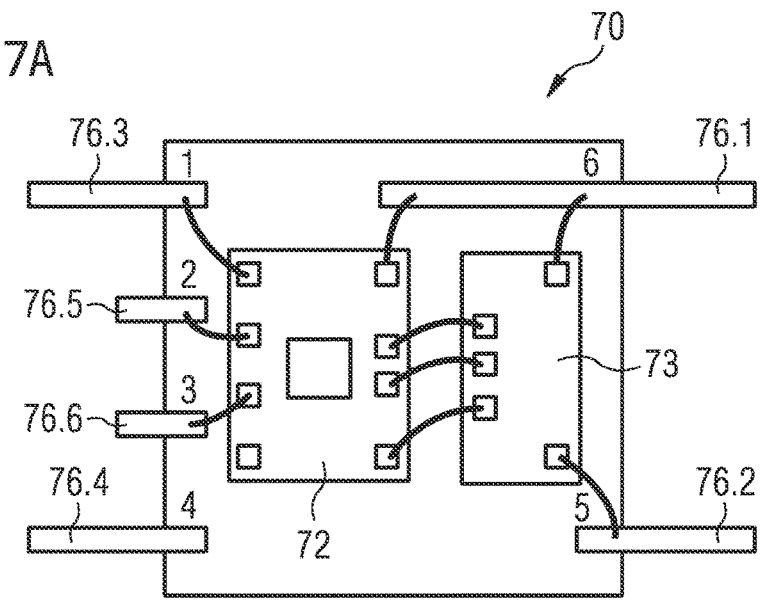
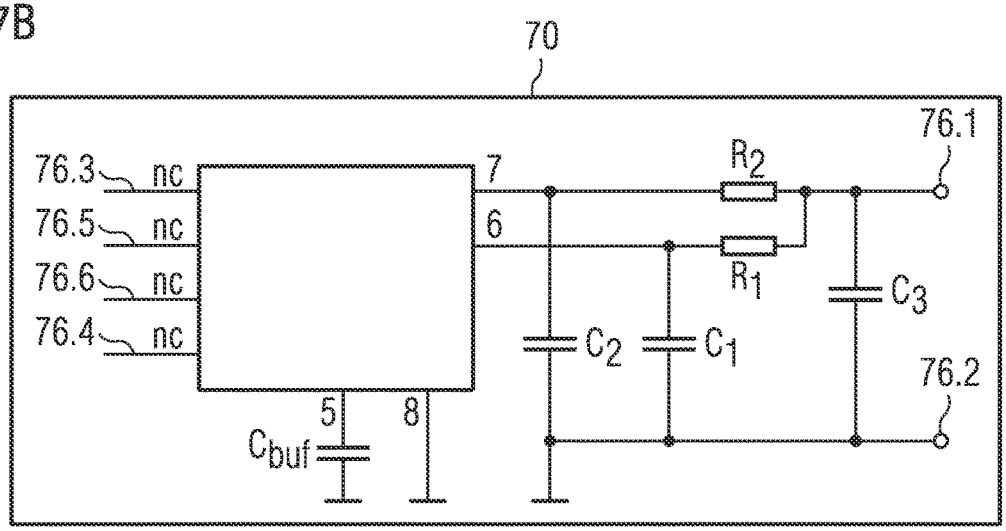

PRESSURE SENSOR MODULE HAVING A SENSOR CHIP AND PASSIVE DEVICES WITHIN A HOUSING

CROSS REFERENCE TO RELATED APPLICATION

This Utility Patent Application claims priority to German Patent Application No. 10 2014 118 769.5 filed Dec. 16, 2014; and which is incorporated herein by reference.

TECHNICAL FIELD

The present application relates to pressure sensor modules, and more particularly to the arrangement of components within pressure sensor modules.

BRIEF SUMMARY OF THE INVENTION

According to one example, a pressure sensor module includes a housing, a pressure sensor chip, and one or more of an integrated passive device (IPD) and discrete passive devices, wherein the pressure sensor chip and one or more of the IPD chip and the discrete passive devices are arranged within the housing.

BACKGROUND

Pressure sensors are critical components in many applications as, for example, in the automotive industry. In this area pressure sensors are particularly employed in airbag systems, especially inside airbag systems, and in tire pressure monitoring systems. A pressure sensor can be integrated within a pressure sensor module and the pressure sensor module can be connected to a board like a printed circuit board (PCB). The PCB can contain additional electrical devices for processing the signals delivered by the pressure sensor. The pressure sensor module may further include electrical contact elements configured to be connected to contact elements of any sort of connection terminal on the customer side. A continuous effort is done for pushing on the miniaturization of pressure sensor modules and also for improving the ease and reliability of securing pressure sensor modules to customer's connection terminals.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 including

FIG. 2 including FIG. 2A-C illustrate schematic top view representations of examples of pressure sensor modules according to the first aspect of the disclosure, including a pressure sensor chip and an IPD chip arranged in a common housing (A), a pressure sensor chip and discrete passive devices arranged in a common housing (B), and a pressure sensor chip, an IPD chip and discrete passive devices arranged in a common housing (C).

FIG. 4 including

FIG. 7 including FIGS. 7A and 7B illustrate a schematic top view representation of an example of a pressure sensor module according to the second aspect depicting electrical connections between the pressure sensor chip, the IPD chip and the external contact elements (A) and a schematic circuit representation of an example of a pressure sensor chip (B).

DETAILED DESCRIPTION

Figure 1A:
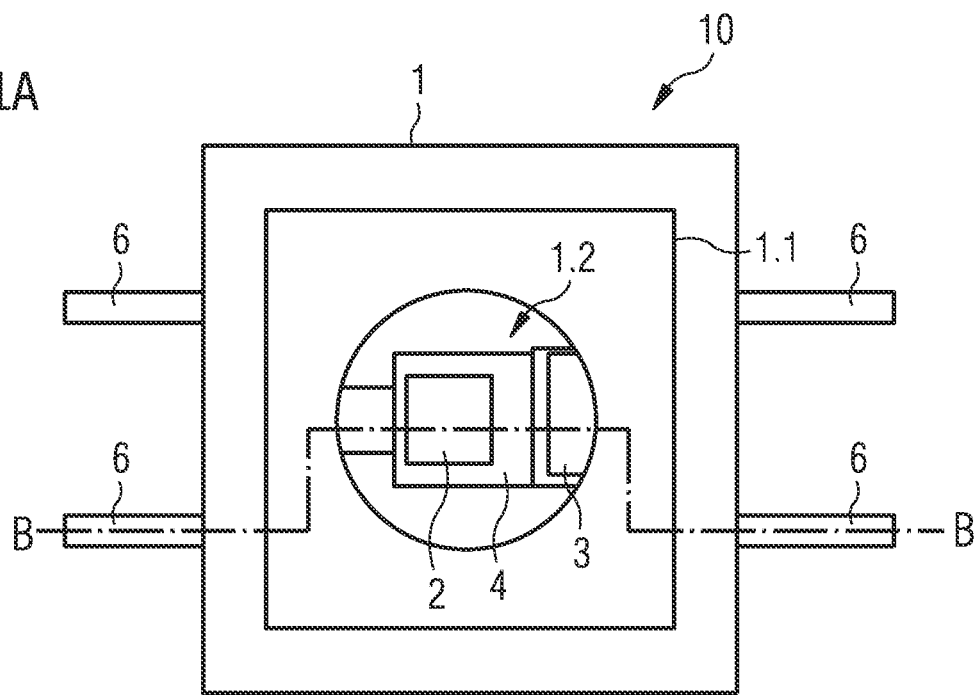
FIGS. 1A and 1B illustrates schematic top view (A) and cross-sectional side view (B) representations of a pressure sensor module according to an example of a first aspect of the disclosure, the pressure sensor module including a pressure sensor chip and an integrated passive device (IPD) chip arranged in a side-by-side manner in a common housing.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are illustrated in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In the following detailed description, reference is made to the accompanying drawings, which form a part hereof, and in which is illustrated by way of illustration specific aspects in which the invention may be practiced. In this regard, directional terminology, such as "top," "bottom," "front," "back," etc., may be used with reference to the orientation of the figures being described. Since components of described devices may be positioned in a number of different orientations, the directional terminology may be used for purposes of illustration and is in no way limiting. It is understood that other aspects may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e., that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The examples of pressure sensor modules described herein may include pressure sensor chips and other kind of chips like, for example, integrated passive device (IPD) chips. At least part or all of these chips may include semiconductor chips. The semiconductor chips can be manufactured on the basis of a specific semiconductor material, for example Si, SiC, SiGe, GaAs, GaN, AlGaAs, but can also manufactured on the basis of any other semiconductor material and, furthermore, may contain inorganic and/or organic materials that are not semiconductors, such as for example insulators, plastics or metals.

The examples of a pressure sensor module may include an encapsulant or encapsulating material having the pressure sensor chip and one or more of the integrated passive device chip or the discrete passive devices embedded therein. The encapsulating material can be any electrically insulating material like, for example, any kind of molding material, any kind of resin material, or any kind of epoxy material. The encapsulating material can also be a polymer material, a polyimide material, a thermoplast material, a silicone material, a ceramic material, and a glass material. The encapsulating material may also include any of the above-mentioned materials and further include filler materials embedded therein like, for example, thermally conductive increments. These filler increments can be made of AlO or $Al_2O_3$, AlN, BN, or SiN, for example. Furthermore the filler increments may have the shape of fibers and can be made of carbon fibers or nanotubes, for example.

Figure 1B:
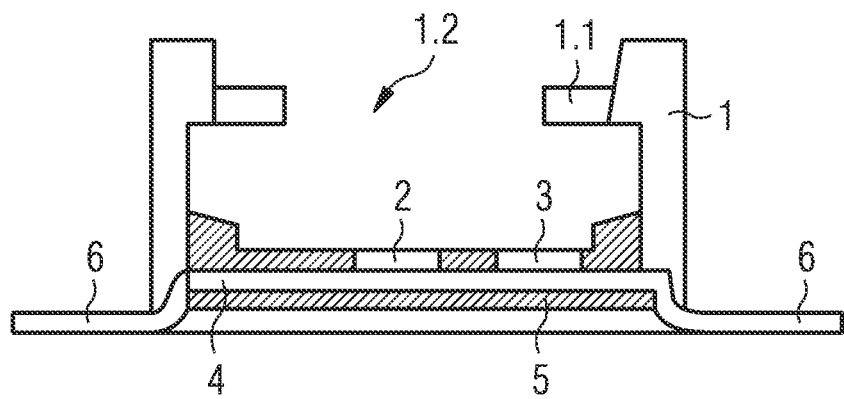

FIG. 1 includes FIGS. 1A and 1B and illustrates in schematical form a top view representation (A) and a cross-sectional side view representation (B) along line B-B of FIG. 1A of an example pressure sensor module according to a first aspect of the disclosure. The pressure sensor module 10 of FIG. 1 includes a housing 1, a pressure sensor chip 2, and an integrated passive device (IDP) chip 3, wherein the pressure sensor chip 2 and the IPD chip 3 are arranged within the housing 1. According to a further example thereof, the IPD chip 3 can be either replaced by discrete passive devices or discrete passive devices can be supplementally employed which will be illustrated by further examples below. As a result thereof, the pressure sensor chip 2 and one or more of the IPD chip 3 and discrete passive devices are arranged within the housing 1.

According to an example of the pressure sensor module 10 of the first aspect, the pressure sensor module 10 further includes a leadframe 4, wherein the pressure sensor chip 2 and one or more of the IPD chip 3 and the discrete passive devices are connected to different portions of the leadframe 4. The pressure sensor chip 2 and the IPD chip 3 can, for example, be mounted on die pads of the leadframe 4.

According to an example of the pressure sensor module 10 of the first aspect, the pressure sensor module 10 further includes an encapsulation material 5 encapsulating the pressure sensor chip 2 and one or more of the IPD chip 3 and the discrete passive devices. The encapsulation material 5 can be disposed in such a way that it encapsulates the pressure sensor chip 2 and the IPD chip 3 and/or the passive discrete devices and also the main portions of the leadframe 4.

According to an example of the pressure sensor module 10 of the first aspect, the pressure sensor chip 2 and the IPD chip 3 and/or the passive discrete devices are not mounted on a printed circuit board (PCB) and, moreover, the interior of the housing 1 does not contain a PCB at all.

According to an example of the pressure sensor module 10 of the first aspect, the housing 1 has in a top view a rectangular or quadratic shape as will be seen in further examples below. According to a further example, the housing 1 is made of a molding compound. The housing 1 may further include at its upper portion a circumferential inwardly extending protrusion 1.1. The protrusion 1.1 may include a central, circular open passage 1.2 to the pressure sensor chip 2.

According to an example of the pressure sensor module 10 of the first aspect, the pressure sensor chip 2 and the IPD chip 3 and/or the discrete passive devices are electrically connected with each other. The electrical connections can, for example, be realized by way of wire bonds.

According to an example of the pressure sensor module 10 of the first aspect, the IPD chip 3 includes exclusively passive electronic devices as, for example, resistors and/or inductors and/or capacitors.

According to an example of the pressure sensor module 10 of the first aspect, the pressure sensor chip 2 includes a pressure sensor (not illustrated) and an electronic circuit (not illustrated) configured to readout the pressure sensor. According to this example, the pressure sensor and the readout electronic circuit are integrated within one and the same semiconductor chip. According to another example, the pressure sensor chip 2 exclusively contains the pressure sensor and the readout electronic circuit is incorporated in a further semiconductor chip arranged within the housing 1. The further semiconductor chip could be arranged in a lateral side-by-side manner with respect to the pressure sensor chip 2 or in a stacked relationship with respect to the pressure sensor chip 2.

According to an example of the pressure sensor module 10 of the first aspect, the pressure sensor module 10 further includes external contact elements 6 configured to be attached to a printed circuit board and to form electrical connections with contact elements of the printed circuit board. According to an example thereof, the external contact elements 6 extend outwardly beyond an outer wall of the housing 1.

According to a further example thereof, the external contact elements 6 may be formed in such a way that they include a plain lower surface which is flush with the lower surface of the housing 1 so that the pressure sensor module 10 can be mounted on a printed circuit board (PCB) by placing it with the lower surface of the housing 1 onto the PCB and connecting the external contact elements 6 to electrical contact elements of the PCB.

According to a further example thereof, the external contact elements 6 are configured so that they can be easily welded to electrical contact elements like lead frame connectors of a customer side terminal like, for example, a customer side housing by employing, for example, laser welding or resistance welding. According to a further example thereof, the external contact elements 6 include a metallic body wherein a portion of the surface of the metallic body is covered with a material layer, the material of the material layer configured to facilitate welding of the free ends to the electrical contact elements of the PCB. According to a further example thereof, the material of the material layer includes one or more of NiNiP (laser welding) and Sn (resistance welding).

According to an example of the pressure sensor module 10 of the first aspect, the pressure sensor module 10 includes a leadframe 4, wherein the external contact elements 6 are connected to or contiguous with the leadframe 4. According to a further example thereof, the external contact elements 6 are situated in a plane offset from a plane of a central portion of the leadframe 4 on which the pressure sensor chip 2 and the IPD chip 3 and/or the passive discrete devices are mounted.

According to a further example thereof, an equal number of external contact elements 6 are disposed at each one of two opposing side edges of the housing 1. According to a further example thereof, two external contact elements 6 are disposed at each one of two opposing side edges of the housing 1. Examples thereof will be illustrated and explained below.

According to an example of the pressure sensor chip 10 of the first aspect, the external contact elements have the form of elongated strips which may have a rectangular shape and which may have a length-to-width ratio greater than 4. The length of the elongated strips or bars may be greater than 1 mm, in particular in a range from 1.0 mm to 3.0 mm.

According to an example of the pressure sensor module 10 of the first aspect, the external contact elements 6 include one or more of at least one first external contact element connected with one or more of the IPD chip 3 and the discrete passive devices, at least one second external contact element connected with the pressure sensor chip 2, and at least one third external contact element connected with neither one of the IPD chip 3, the discrete passive devices and the pressure sensor chip 2. According to a further example thereof, the at least one third external contact element can be arranged in such a way that it has no electrical function but merely serves as an additional mechanical connection element which will be connected to a customer side PCB in the same way as the first and second external contact elements. According to a further example thereof, it might be the case that some of the external contact elements like, for example the at least one second external contact element, are used only for calibration purposes after fabrication of the pressure sensor module but do not have any electrical functions during operation of the pressure sensor module. An example therefore will be illustrated and explained below in further detail.

For reasons of simplicity the pressure sensor chip 2 is not illustrated in detail in FIG. 1. According to an example of the pressure sensor module 10 of the first aspect, the pressure sensor chip 2 includes a suspended membrane, in particular a piezo-active suspended membrane or a capacitive suspended membrane. According to an example, a first main face of the suspended membrane is facing outwards and a second main face of the membrane opposite to the first main face is facing to an internal cavity. In such a way an outer atmosphere or medium, in particular air, may flow through the opening 1.2 to the membrane of the pressure sensor chip 2 to impinge on the membrane and to cause movement of the membrane in response to the pressure of the medium impinging on the first main face of the membrane. Electrical signals are generated due to the movement or displacement of the membrane and these electrical signals are delivered to an electrical read-out circuit. According to an example, the pressure sensor chip 2 can also be based on a so-called manifold absolute pressure (MAP) sensor.

FIG. 2 includes FIGS. 2A, 2B and 2C and illustrates in schematical form top view representations of different examples of pressure sensor modules according to the first aspect of the disclosure wherein particular details as were illustrated in FIG. 1 are omitted here for reasons of simplicity.

FIG. 2A illustrates a pressure sensor module 20A similar to the one illustrated and described with respect to FIG. 1, wherein a pressure sensor chip 22 and an IPD chip 23 are arranged within a common housing and mounted on different portions of a leadframe 24.

FIG. 2B illustrates a pressure sensor module 20B in which instead of an IPD chip discrete devices 25 are arranged together with the pressure sensor chip 22 within a common housing. The discrete devices 25 may include one or more of capacitors, resistors and inductors. The pressure sensor chip 22 and the discrete devices 25 may be mounted on different portions of a leadframe 24.

FIG. 2C illustrates a pressure sensor module in which an IPD chip 26 as well as discrete devices 27 are arranged together with the pressure sensor chip 22 within a common housing. The discrete devices 27 may include one or more of capacitors, resistors and inductors. The pressure sensor chip 22, the IPD chip 26 and the discrete devices 27 may be mounted on different portions of a leadframe 24.

Figure 3:
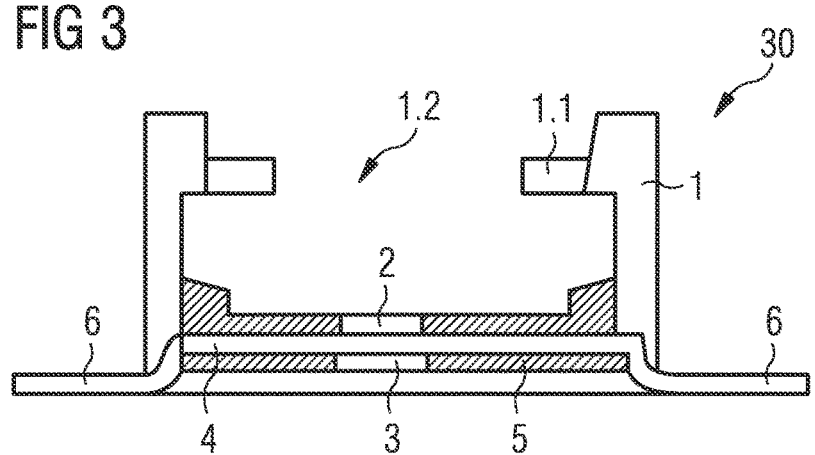
FIG. 3 illustrates a schematic cross-sectional side view representation of an example of a pressure sensor module according to the first aspect of the disclosure, the pressure sensor module including a pressure sensor chip and an IPD chip arranged on the front side and the backside of a leadframe, respectively.

FIG. 3 illustrates a schematic cross-sectional representation of an example of a pressure sensor module according to the first aspect. In the examples of pressure sensor modules as illustrated in FIG. 1 and FIG. 2 the pressure sensor chip and the IPD chip or the discrete devices are both mounted on an upper main face of the leadframe. The pressure sensor module 30 as illustrated in FIG. 3 different from the examples of FIGS. 1 and 2 in so far as the pressure sensor chip 2 and the IPD chip 3 are mounted on different main faces of the leadframe 4. Whereas the pressure sensor chip 2 is mounted on the upper main face of the leadframe 4, the IPD chip 3 is mounted on the lower main face of the leadframe 4. If discrete passive devices are used instead of or in addition to the IPD chip 3, the discrete passive devices can also be mounted on the lower main face of the leadframe 4. If both the IPD chip 3 and discrete passive devices are used, it is also possible that one of them is mounted on the upper main face of the leadframe 4 and the other one of them is mounted on the lower main face of the leadframe 4. Anyway the possibility of mounting the IPD chip 3 and/or the discrete passive devices on the lower main face of the leadframe 4 provides a greater flexibility and freedom for dimensioning the pressure sensor chip 2 and placing it on the upper main face of the leadframe 4.

Further examples of the pressure sensor module 10 according to the first aspect can be configured or formed by combining it with anyone of the various examples or features which will be outlined further below in connection with the pressure sensor module 40 according to a second aspect.

Figure 4A:
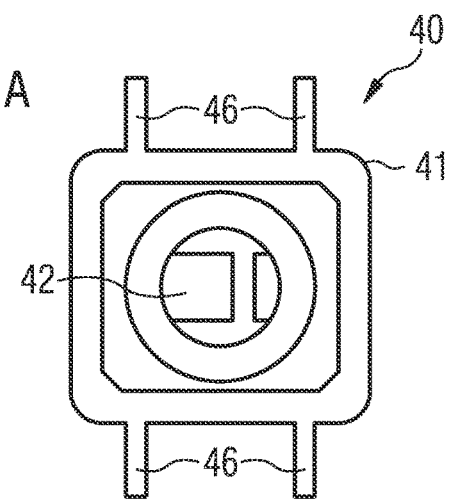
FIGS. 4A and 4B illustrate schematic top view representations of examples of pressure sensor modules according to a second aspect of the disclosure, including a pressure sensor module having four external contact elements having weldable free ends (A), and a similar pressure sensor module mounted within a customer side terminal or housing (B).
Figure 4B:
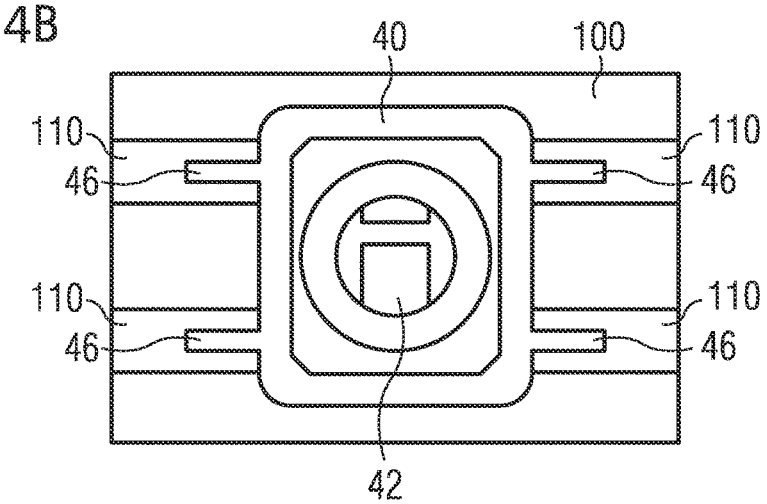

FIG. 4 includes FIGS. 4A and 4B and illustrates in schematical form a top view representation of an exemplary pressure sensor module according to a second aspect of the disclosure (A) and a schematic top view representation of the same or a similar pressure sensor module mounted in a customer side housing (B). The pressure sensor module 40 of FIG. 4 includes a housing 41, a pressure sensor chip 42 arranged within the housing 41, and external contact elements 46, wherein the external contact elements 46 are configured to be welded to a metallic surface of, for example, a customer side connection terminal 100 as illustrated schematically in FIG. 4B. According to an example thereof the external contact elements 46 extend through an outer wall of the housing 1 and more specifically have the form of elongated strips or bars, which may have a length-to-width ratio greater than 4. The length of the elongated strips or bars may be greater than 1 mm, in particular in a range from 1.0 mm to 3.0 mm.

According to an example of the pressure sensor module 40 of the second aspect, the external contact elements 46 include a metallic body wherein a portion of the surface is covered with a material layer, the material of the material layer configured to facilitate welding of the external contact elements to metallic connection elements of a connection terminal. According to an example thereof the material of the material layer includes one or more of NiNiP and Sn. A material layer based on NiNiP has been found to facilitate laser welding and a material layer based on Sn has been found to facilitate resistance welding. According to an example the entire surface of the external contact elements 46 is covered with the material layer. According to another example only a specific portion is covered with the material layer like, for example, only a lower main face which is the portion which makes contact with the metallic surface of the customer side housing.

As can be seen in FIG. 4B, the pressure sensor module 40 has been inserted in a customer side terminal or housing 100. The customer side housing 100 includes electrical lines 110 or traces for placing the pressure sensor module thereupon with the external contact elements 46 being welded to the electrical lines 110. The customer side housing 100 may include the same number of electrical lines 110 as the number of external contact elements 46 contained in the pressure sensor module 10.

Further examples of the pressure sensor module 40 according to the second aspect can be configured or formed by combining it with anyone of the various examples or features which were outlined in connection with the pressure sensor module 10 according to the first aspect.

Figure 5:
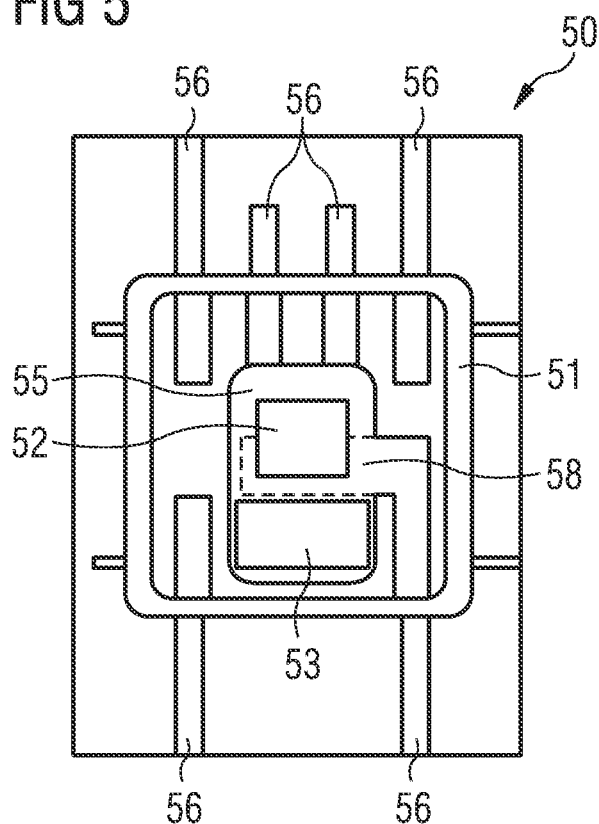
FIG. 5 illustrates a layout representation of an example of a pressure sensor module having external contact elements one of which being connected with a heat sink.

FIG. 5 illustrates a layout representation of an example of a pressure sensor module having external contact elements one of which being connected with a heat sink. The pressure sensor module 50 of FIG. 5 can be one according to the first aspect or one according to the second aspect. The pressure sensor module 50 of FIG. 5 includes a pressure sensor chip 52 and an IPD chip 53 disposed in a side-by-side configuration within a common housing 51. The chips 52 and 53 can be embedded in an encapsulation material 55. The chips 52 and 53 can be electrically connected to wires 56 which can be part of a leadframe. The pressure sensor chip 52 can be mounted on a heat sink 58 wherein the heatsink 58 can be based on a metallic material like, for example, copper, and moreover the heatsink 58 can also be part of the leadframe. The main function of the heatsink 58 is to collect the heat produced by the pressure sensor chip 52 in operation and to dissipate the heat to the outside. For this purpose the heat sink 58 may include lateral dimensions comparable to those of the pressure sensor chip 52 and moreover be connected to one of the wires 56 to be able to conduct the heat to the outside. The heatsink 58 can also have an electrical function by, for example, connecting the pressure sensor chip 52 to the outside.

Figure 6:
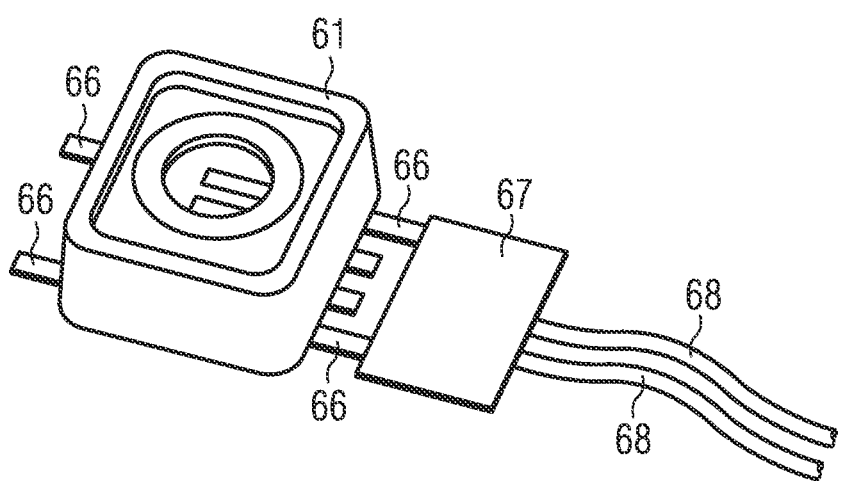
FIG. 6 illustrates a schematic perspective representation of an example of a pressure sensor module according to the second aspect, the pressure sensor module including a wire connector coupled to two of the external contact elements.

FIG. 6 illustrates a schematic perspective representation of an example of a pressure sensor module comprising a wire connector coupled to two of the external contact elements. The pressure sensor module 60 of FIG. 6 can be one according to the first aspect or one according to the second aspect. The pressure sensor module 60 of FIG. 6 includes a housing 61 and external contact elements 66 in a similar configuration as described in one of the above examples. As was also indicated above, it can be the case that particular ones of the external contact elements 66 are in fact dummies, which means that they are either not connected electrically to any one of the chips or devices of the module 60 or they are electrically connected to anyone of the chips or devices but the electrical connection is of no use for the operation of the module 60 but only for calibration purposes in the fabrication process of the module 60. In the module 60 of FIG. 6 the two external contact elements 66 on the left side of the module 60 are dummies and only the two external contact elements 66 on the right side of the module 60 are real. The example of a pressure sensor module 60 of FIG. 6 has the purpose to illustrate that on the customer side there are not only housings such as that illustrated in FIG. 4B but also other forms of connection terminals, in particular those having connector elements like female connectors or female jacks, for example. For this purpose a wire connector 67 can be employed which is one side connected with the two external contact elements 66 in question and which on the other side is connected with wires 68. The wires 68 can be flexible wires, for example, so that they can be flexibly connected with any form of customer side connector elements. The wires 68 can also be part of a male connector which can be connected to a customer side female connector. The wire connector 67 can have different form and shape. Its sole purpose is to internally connect each one of the external contact elements 66 with one of the wires 68, respectively.

FIG. 7 comprising FIGS. 7A and 7B illustrates a layout representation of an example of a pressure sensor module depicting electrical connections between the pressure sensor chip, the IPD chip and the external contact elements (A) and a schematic circuit representation of an example of a pressure sensor chip (B). The pressure sensor module 70 of FIG. 7 can be one according to the first aspect or one according to the second aspect. The pressure sensor module 70 includes a pressure sensor chip 72 and an IPD chip 73 both of which include contact pads at their respective upper main faces. The chips 72 and 73 are electrically connected with each other by means of bond wires. The IPD chip 73 exclusively contains passive electric devices, namely the resistors R1 and R2 and the capacitors C1, C2, C3 and $C_{buf}$. The pressure sensor module 70 further includes six external contact elements 76.1 to 76.6 wherein only the external contact elements 76.1 and 76.2 are important for the operation of the pressure sensor module 70. The contact element 76.1 is connected to the ground potential (GND) and with both chips 72 and 73 and the contact element 76.2 is connected with the IPD chip 73 whereas FIG. 7B illustrates that the electrical output signals of the pressure sensor chip 72 are delivered to the IPD chip 73 and from there to the contact element 76.2. The contact elements 76.3, 76.5 and 76.6 are connected with the pressure sensor chip 72 and are only important during the fabrication process of the pressure sensor module 70 for calibration purposes. Thereafter the contact elements 76.5 and 76.6 do not serve any purpose whereas the contact element 76.3 can be used as mechanical support, i.e., for welding to a customers substrate as was illustrated in FIG. 4B. The contact element 76.4 is from the beginning not electrically connected with any one of the chips 72 and 73 and is only used for mechanical support, i.e., for welding to a customers substrate as was illustrated in FIG. 4B. The contact elements 76.1 to 76.4 can be provided with an appropriate material layer to facilitate welding as was also described above.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A pressure sensor module comprising:
   a housing defining an open interior cavity exposed to an exterior environment via a passage through the housing;
   a pressure sensor chip; and
   one or more of an integrated passive device (IPD) chip and discrete passive devices;
   wherein
   the pressure sensor chip and one or more of the IPD chip and the discrete passive devices are arranged within the interior cavity of the housing.

2. The pressure sensor module according to claim 1, wherein
   the pressure sensor chip and one or more of the IPD chip and the discrete passive devices are electrically connected with each other.

3. The pressure sensor module according to claim 1, wherein the pressure sensor chip comprises a pressure sensor and an electronic circuit configured to readout the pressure sensor.

4. The pressure sensor module according to claim 1, further comprising:
   a leadframe, wherein the pressure sensor chip and one or more of the IPD chip and the discrete passive devices are connected to different portions of the leadframe.

5. The pressure sensor module according to claim 1, further comprising:
   an encapsulation material encapsulating the pressure sensor chip and one or more of the IPD chip and the discrete passive devices.

6. The pressure sensor module according to claim 1, further comprising:
   external contact elements configured to be attached to a printed circuit board and to form electrical connections with contact elements of the printed circuit board.

7. The pressure sensor module according to claim 6, wherein the external contact elements extend outwardly beyond an outer wall of the housing.

8. The pressure sensor module according to claim 6, wherein the external contact elements are configured to be welded to a metallic surface.

9. The pressure sensor module according to claim 8, wherein the external contact elements each comprise a metallic body wherein portions of the surface of the metallic body are covered with a material layer, the material of the material layer configured to facilitate welding of the external contact elements to the metallic surface.

10. The pressure sensor module according to claim 9, wherein the material of the material layer comprises one or more of NiNiP and Sn.

11. The pressure sensor module according to claim 6, further comprising:
    a leadframe, wherein the external contact elements are connected to or contiguous with the leadframe.

12. The pressure sensor module according to claim 6, wherein an equal number of external contact elements are disposed at each one of two opposing side edges of the housing.

13. A pressure sensor module comprising:
    a housing;
    a pressure sensor chip; and
    an integrated passive device (IPD) chip, wherein the IPD chip comprises exclusively passive electronic devices.

14. A pressure sensor module comprising:
    a housing;
    a pressure sensor chip;

one or more of an integrated passive device (IPD) chip and discrete passive devices, wherein the pressure sensor chip and one or more of the IPD chip and the discrete passive devices are arranged within the housing; and external contact elements configured to be attached to a printed circuit board and to form electrical connections with contact elements of the printed circuit board, wherein the external contact elements comprise one or more of:
- at least one first external contact element connected with one or more of the IPD chip and the discrete passive devices;
- at least one second external contact element connected with the pressure sensor chip; and
- at least one third external contact element connected with neither one of the IPD chip, the discrete passive devices and the pressure sensor chip.

15. A pressure sensor module, comprising:
a housing defining a open interior cavity exposed to an exterior environment via a passage through the housing;
a leadframe, a portion of the leadframe disposed within the cavity;
a pressure sensor chip disposed on the leadframe within the cavity;
one or more of an integrated passive device (IPD) chip or discrete passive devices disposed on the leadframe within the cavity; and
external contact elements connected with the leadframe, the external contact elements configured to allow welding to metallic connection elements of a connection terminal.

16. The pressure sensor module according to claim 15, wherein
the external contact elements are configured to be attached to a printed circuit board and to be welded to contact pads of the printed circuit board.

17. The pressure sensor module according to claim 15, further comprising:
an encapsulation body encapsulating the pressure sensor chip and one or more of the IPD chip and the discrete passive devices, wherein
the encapsulation body comprises an opening so that the pressure sensor is exposed to the outside.

18. A pressure sensor module comprising:
a housing defining an open interior cavity exposed to an exterior environment via a passage through the housing;
a leadframe having an upper and a lower surface, portions of the leadframe, including the upper and lower surfaces, disposed within an interior cavity;
a pressure sensor chip; and
one or more of an integrated passive device (IPD) chip and discrete passive devices; wherein the pressure sensor chip and one or more of the IPD chip and the discrete passive devices are arranged on at least one of the upper and lower surfaces of the portions of the leadframe within the housing.

* * * * *